United States Patent
Xie

(10) Patent No.: US 9,214,506 B2
(45) Date of Patent: Dec. 15, 2015

(54) PIXEL UNIT DRIVING CIRCUIT, METHOD FOR DRIVING PIXEL UNIT DRIVING CIRCUIT AND DISPLAY DEVICE

(71) Applicant: BOE TECHNOLOGY GROUP CO., LTD., Beijing (CN)

(72) Inventor: Hongjun Xie, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 35 days.

(21) Appl. No.: 14/098,786

(22) Filed: Dec. 6, 2013

(65) Prior Publication Data

US 2014/0159609 A1 Jun. 12, 2014

(30) Foreign Application Priority Data

Dec. 10, 2012 (CN) .......................... 2012 1 0528323

(51) Int. Cl.
*G09G 3/30* (2006.01)
*H01L 27/32* (2006.01)
*G09G 3/32* (2006.01)

(52) U.S. Cl.
CPC .......... *H01L 27/3265* (2013.01); *G09G 3/3233* (2013.01); *G09G 2300/0852* (2013.01); *G09G 2300/0861* (2013.01)

(58) Field of Classification Search
CPC ........... H01L 27/3262; H01L 27/3265; G09G 3/3208
See application file for complete search history.

(56) References Cited

U.S. PATENT DOCUMENTS

2006/0028408 A1  2/2006 Kim
2011/0279433 A1* 11/2011 Ryu .............................. 345/211

FOREIGN PATENT DOCUMENTS

| CN | 101739947 A | 6/2010 |
| CN | 102651197 A | 8/2012 |
| CN | 202957021 U | 5/2013 |
| JP | 2007156476 A | 6/2007 |

OTHER PUBLICATIONS

Chinese First Office Action dated May 21, 2014 corresponding to application No. 201210528323.9.

* cited by examiner

*Primary Examiner* — Joseph Haley
*Assistant Examiner* — Ifedayo Iluyomade
(74) *Attorney, Agent, or Firm* — Nath, Goldberg & Meyer; Jerald L. Meyer; Leonid D. Thenor

(57) ABSTRACT

A pixel unit driving circuit provides a method for driving a pixel unit for operating a display device. The circuit comprises four TFT transistors and two capacitors. The display process is divided into three processes, which are a precharging phase, a compensation phase and a display phase. As compared with the conventional pixel structure, the nonuniformity and the shift of the threshold voltage of the depleted TFT or the enhanced TFT driving transistor, and the nonuniformity of the OLED voltage may be effectively compensated.

6 Claims, 2 Drawing Sheets

PIXEL UNIT DRIVING CIRCUIT, METHOD FOR DRIVING PIXEL UNIT DRIVING CIRCUIT AND DISPLAY DEVICE

CROSS REFERENCE OF RELATED APPLICATIONS

The present application is based on and claims the benefit of priority of Chinese Patent Application No. 201210528323.9 filed on Dec. 10, 2012, the entire contents of which are hereby incorporated by reference.

BACKGROUND OF THE INVENTION

1. Field of the Invention

This invention relates to a circuit structure of a liquid crystal display device, and more particularly to a pixel unit driving circuit, a driving method and a display device.

2. Description of the Prior Art

An Organic Light Emitting Diode (OLED) is increasingly applied in a high performance display device as a current mode light emitting device. Since a conventional passive matrix OLED needs shorter driving time for an individual pixel as the display size is increased, a large transient current and a large power consumption are required. Meanwhile, applying a large current will result in a too large voltage drop on an Indium Tin Oxide (ITO) line, and the operation voltage of OLED is too high, its efficiency is decreased. An Active Matrix OLED (AMOLED) progressively scans inputted OLED current through a switch transistor so that above mentioned problems are solved.

In the design of an AMOLED back panel, the main problem needs to be solved is that brightness between pixels is not uniform.

Firstly, AMOLED builds up a pixel circuit by using a Thin Film Transistor (TFT) so as to provide corresponding current for an OLED device, for example by using a low temperature poly-silicon thin film transistor (LTPS TFT) or an oxide TFT. As compared with a general Amorphous Silicon TFT (a-Si TFT), LTPS TFT and Oxide TFT have the characteristics of having a higher migration rate and being more stable, which are more suitable for AMOLED display. However, since a crystallization process has its limitations, LTPS TFT manufactured in a large area of a glass substrate has nonuniform electrical characteristics, such as a threshold voltage and a migration rate. Such nonuniformity will result in current difference and brightness difference of an OLED display device which will be sensed by human eyes, that is a mura phenomena. Although the process of Oxide TFT has a good uniformity, like a-Si TFT, its threshold voltage will shift under pressure and high temperature for a long time. Since display pictures are different, the amounts of shift on the threshold values of TFTs on each part of the panel are different, which will result in differences in display brightness. Since such difference is related to the pictures that shown previously, a ghost phenomena will exhibit.

Secondly, in an application of displaying in a large size, since the power line of the back panel has a certain resistance, the power voltage close to ARVDD power supply position is higher than the power voltage away from the power supply position, which is called IR Drop. IR Drop will result in differences in current in different areas which leads to the mura is generated during the displaying.

AMOLED may be divided into three modes based on driving types: a digital mode, a current mode and a voltage mode. The driving in the voltage mode has the advantages of a fast driving speed and a simple implementation. The voltage mode is suitable for driving a large size panel, but additional TFTs and capacitors are required to compensate the nonuniformity of TFTs, the nonuniformity of IR Drop and OLED.

FIG. 1 is a traditional voltage driving mode pixel circuit structure composed of two TFTs and one capacitor (2T1C). Wherein, a switch transistor T2 transmits the voltage in a data line to the gate electrode of a driving transistor T1, the driving transistor T1 transfers the data voltage into the corresponding current to provide power to the OLED device. During a normal operation, the driving transistor T1 is in the saturation region and provides a constant current during the time for scanning one line. The current can be represented as:

$$I_{OLED} = \frac{1}{2}\mu_n \cdot C_{ox} \cdot \frac{W}{L} \cdot (Vdata - Voled - Vth)^2$$

Wherein, $\mu_n$ is a carrier mobility, $C_{OX}$ is a gate oxide capacitance, W/L is a width to length ratio of the transistor, Vdata is the voltage in the data line, Voled is the operating voltage of OLED shared by all pixel units, Vth is the threshold voltage of the transistor, for an enhanced TFT, Vth is a positive value and for a depleted TFT, Vth is a negative value. As shown in the above equation, if different pixel units have different Vths, their currents are different. If Vth of a pixel is shifted over time, the current may changed over time and ghosting may be caused. Since the nonuniformity of the OLED devices causes that work voltages of OLEDs are different, which also causes current differences.

There are many kinds of pixel structures which aim to compensate the nonuniformity of Vth and the shift, and nonuniformity of OLED. Such structures are commonly implemented by connecting TFTs by diodes as shown in FIGS. 2-3. However, such structures are only suitable for the enhanced TFTs, the voltage stored in a depleted TFT does not have the voltage information of Vth which leads to the nonuniformity of Vth cannot be compensated.

SUMMARY OF THE INVENTION

The technical problem to be solved by the embodiment of the present invention is to provide a pixel unit driving circuit, a driving method and a display device, which can effectively compensate the nonuniformity and the shift of the threshold voltage of a N type depleted TFT driving transistor or an enhanced TFT driving transistor, and the nonuniformity of the OLED voltage, as well as improves the display effect.

In order to solve the above technical problem, the embodiment of the present invention provides a pixel unit driving circuit, used for driving OLED, characterized in, comprising:

a first transistor, a second transistor, a third transistor and a fourth transistor, a first capacitor and a second capacitor; wherein, a gate electrode of the first transistor is connected to a drain electrode of the second transistor; a source electrode of the first transistor is connected to a first terminal of the second capacitor, a drain electrode of the fourth transistor and the OLED respectively; a drain electrode of the first transistor is connected to a high level output terminal;

a gate electrode of the second transistor is connected to a first control line, a source electrode of the second transistor is connected to a data line, a drain electrode of the second transistor is connected to the gate electrode of the first transistor;

a gate electrode of the third transistor is connected to a second control line, a source electrode of the third transistor is connected to a reference voltage input terminal, a drain electrode of the third transistor is connected to the gate electrode of the first transistor;

a gate electrode of the fourth transistor is connected to the first control line, a source electrode of the fourth transistor is connected to an initial voltage input terminal, a drain electrode of the fourth transistor is connected to the first terminal of the second capacitor;

a second terminal of the second capacitor is connected to a first terminal of the first capacitor, a second terminal of the first capacitor is connected to the gate electrode of the first transistor and the drain electrode of the second transistor;

the reference voltage input terminal is further connected to the first terminal of the first capacitor and the second terminal of the second capacitor.

Wherein, the first control line is a first gate scanning signal control line and the second control line is a second gate scanning signal control line, during a pixel charging phase, the first control line is at high level, the second control line is at low level;

during a pixel compensation phase, the first control line and the second control line are both at low level;

during a phase of driving OLED to emit light, the first control line is at low level and the second control line is at high level.

Wherein, the first transistor, the second transistor, the third transistor and the fourth transistor are all N type thin film transistors.

Wherein, the first transistor, the second transistor, the third transistor and the fourth transistor are all depleted thin film transistors.

The embodiment of the present invention further provides a method for driving the pixel unit driving circuit, comprising:

a pixel charging step, wherein, the first control line controls the second transistor and the fourth transistor to be on, the second control line controls a third transistor to be off, the data line charges the first capacitor through the second transistor which is on and makes the first transistor on, the initial voltage input terminal charges the second capacitor through the fourth transistor which is on;

a pixel compensation step, wherein, the first control line controls the second transistor and the fourth transistor to be off, the second control line controls the third transistor to be off, the high level output terminal of the power supply charges the second capacitor through the first transistor turned on in the pixel charging step, until the voltage at the first terminal of the second capacitor is $V_{DATA}-V_{th}$, wherein $V_{DATA}$ is a voltage signal of the data line and Vth is a threshold voltage of the first transistor;

a step of driving OLED to emit light, wherein, the first control line controls the second transistor and the fourth transistor to be off, the second control line controls the third transistor to be on, the reference voltage input terminal charges the first capacitor through the third transistor which is on, until the voltage at the second terminal of the first capacitor equals to the voltage of the reference voltage input terminal, and OLED is driven to emit light through the first transistor which is on.

Wherein, the first control line is a first gate scanning signal control line and the second control line is a second gate scanning signal control line;

during a pixel charging phase, the first control line is at high level, the second control line is at low level;

during a pixel compensation phase, the first control line and the second control line are both at the low level;

during a phase of driving OLED to emit light, the first control line is at the low level and the second control line is at the high level.

The embodiment of the present invention further provides a display device, comprising OLED and the pixel unit driving circuit mentioned above; the source electrode of the first transistor included in the pixel unit driving circuit is connected to anode of the OLED, a cathode of the OLED is connected to the ground.

The above technical solutions according the present invention bring out the technical effect as follows.

In the above solutions, a pixel unit driving circuit comprising four transistors and two capacitors is adopted. The nonuniformity and the shift of the threshold voltage of N type depleted TFT or enhanced TFT driving transistor, and the nonuniformity of the OLED voltage may be effectively compensated, and the display effect may be improved. Therefore, such circuit has a wider applicability.

DETAILED DESCRIPTION OF THE PREFERRED EMBODIMENTS

In order to clearly set forth the aim, technical solutions and advantages of embodiments of the present disclosure, the embodiments of the present disclosure are further described in conjunction with drawings and embodiments.

Figure 1:
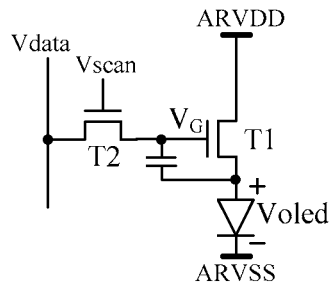
FIG. 1 is a schematic diagram illustrating a voltage driving mode pixel circuit composed of two TFT transistors and one capacitor in the prior art.
Figure 2:
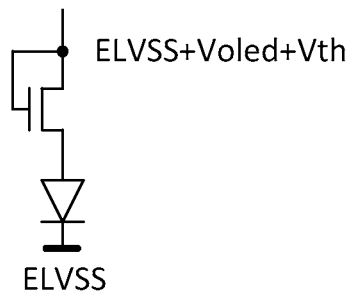
FIG. 2 is a diagram showing a compensation pixel circuit structure with an enhanced TFT transistor in the prior art.
Figure 3:
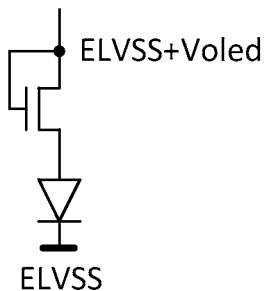
FIG. 3 is a diagram showing a compensation pixel circuit structure with a depleted TFT transistor in the prior art.
Figure 4:
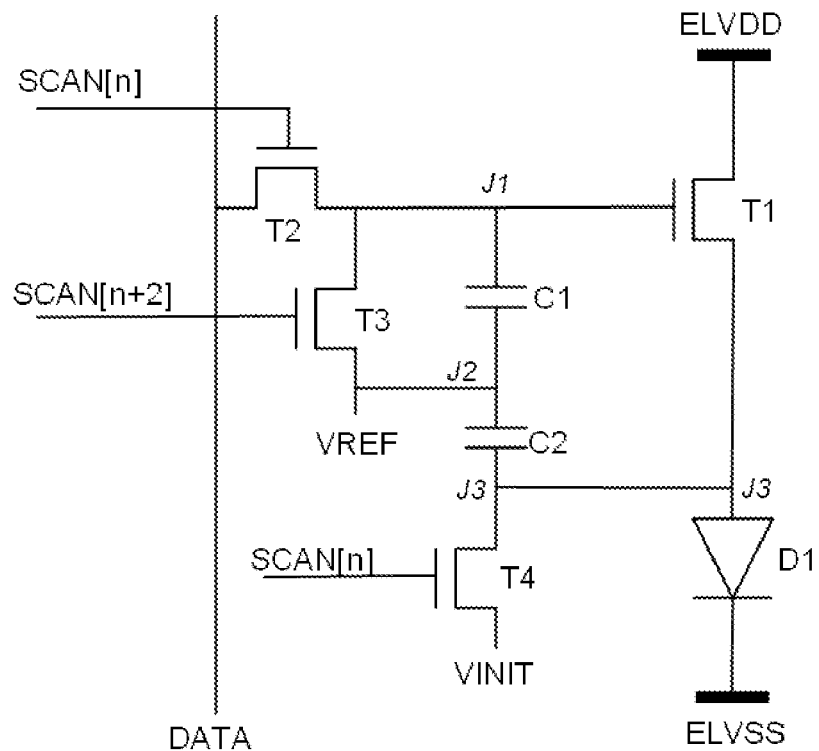
FIG. 4 is a schematic diagram showing the structure of a pixel unit driving circuit according to the embodiment of the present invention.

As shown in FIG. 4, an embodiment of the present invention provides a pixel unit driving circuit, used for driving OLED, comprises: a first transistor T1, a second transistor T2, a third transistor T3 and a fourth transistor T4, a first capacitor C1 and a second capacitor C2; wherein, The gate electrode of the first transistor T1 is connected to the drain electrode of the second transistor T2. The source electrode of the first transistor T1 is connected to a first terminal J3 of the second capacitor C2, the drain electrode of the fourth transistor T4 and the anode of the OLED (a device shown as D1 in FIG. 1) respectively. The cathode of the OLED is connected to the grounded terminal ELVSS; the drain electrode of the first transistor T1 is connected to a high level output terminal ELVDD of the power supply.

The gate electrode of the second transistor T2 is connected to a first control line SCAN (n). The source electrode of the second transistor T2 is connected to a data line DATA. The drain electrode of the second transistor T2 is connected to the gate electrode of the first transistor T1, wherein n is a positive integer, which indicates the number of a control signal.

The gate electrode of the third transistor T3 is connected to a second control line SCAN (n+2). The source electrode of the third transistor T3 is connected to a reference voltage input terminal VREF. The drain electrode of the third transistor T3 is connected to the gate electrode of the first transistor T1 and the drain electrode of the second transistor T2, wherein the reference voltage is at a DC level.

The gate electrode of the fourth transistor T4 is connected to the first control line SCAN (n). The source electrode of the fourth transistor T4 is connected to an initial voltage input terminal VINIT. The drain electrode of the fourth transistor T4 is connected to the first terminal J3 of the second capacitor C2 and the source electrode of the first transistor T1. Wherein, the initial voltage is an initial voltage used in compensation reset, and is a constant DC level value.

The second terminal J2 of the second capacitor C2 is connected to the first terminal of the first capacitor at the node of J2, the second terminal J1 of the first capacitor C1 is connected to the gate electrode of the first transistor T1 and the drain electrode of the second transistor T2.

The reference voltage input terminal VREF is also connected to the first terminal of the first capacitor C1 and the second terminal of the second capacitor C2 at the node of J2.

Figure 5:
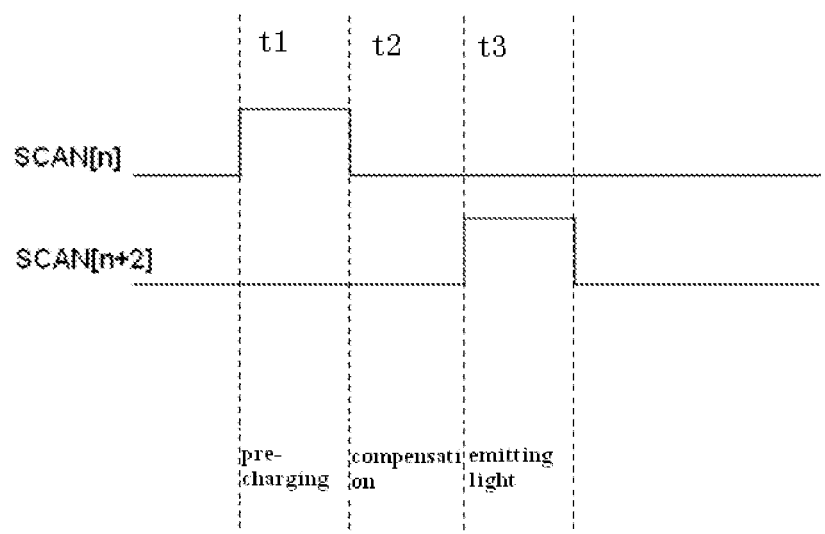
FIG. 5 is a schematic diagram illustrating a pulse time sequence of a first control line and a second control line of the circuit shown in FIG. 4.

As shown in FIG. 5, the process of the transistor circuit if divided into three phases over time, which are period t1: pre-charging phase for the pixels, period t2: compensation phase, period t3: light emitting and display phase. Wherein, the first control line SCAN (n) is a first gate scanning signal control line, and its pulse signal is: at a high level during a time period of t1, a low level during a time period of t2, and a low level during a time period of t3.

The second control line SCAN (n+2) is a second gate scanning signal control line, and its pulse signal is: at a low level during the period t1, a low level during the period t2, and a high level during the period t3.

Furthermore, in the embodiment of the present invention, the first transistor T1, the second transistor T2, the third transistor T3 and the fourth transistor T4 are all N type thin film transistors, which are used only for illustrative purpose.

In the above embodiments, the operation procedure of the circuit, which is composed of the N type TFT transistors T1-T4 and the storage capacitors C1, C2, is as follows. SCAN [n] and SCAN[n+2] are line scanning control lines. The signal control sequence is shown in FIG. 5.

The first phase is a pre-charging phase, which aims to pre-charge the source terminal J3 of the TFT T1 and the node of J1. As shown in FIGS. 4 and 5, the control signal SCAN [n] is at a switch level VGH (a high level), SCAN [n+2] is at a switch level VGL (a low level), at this time, T2 and T4 are on and T3 is off. The level in the DATA line is charged into the second terminal (that is node J1) of the first capacitor C1, the first terminal J3 of the second capacitor C2 is charged as VINIT level, the second terminal of the second capacitor C2 or the first terminal of the first capacitor C1, that is the nod of J2 is at a level of VREF. VINIT level is low enough so that OLED will not emit light and T1 is on. Capacitors C1 and C2 are used to store charge so as to keep the level of the node stable.

The second phase is a compensation phase. As shown in FIGS. 4-5, in this phase, SCAN [n] is at a switch level VGL (a low level), SCAN [n+2] is at a switch level VGL (a low level), at this time, TFT T2, T3 and T4 are off. In this phase, the first terminal J3 of the second capacitor C2 is charged by ELVDD (a high level output terminal of the power supply) through T1 which is on, until the voltage is equal to $V_{DATA}$-Vth, wherein, the $V_{DATA}$ stands for the voltage value on the data line, Vth stands for the threshold voltage of the transistor. When the compensation phase is finished, voltage difference cross the storage capacitor C2 is VREF-$V_{DATA}$+Vth.

The third phase is a phase continuously emitting light. As shown in FIGS. 4-5, in this phase, SCAN [n] is at a switch level VGL (a low level), SCAN [n+2] is at a switch level VGH (a high level), meanwhile, TFT T3 is on and TFT T2 and T4 are off. The second terminal of the first capacitor C1 (node J1) is charged to be VREF. Because of the bootstrap effect of the capacitor C2, the voltage VGS (the voltage between the gate electrode and the source electrode of T1) becomes VREF−($V_{DATA}$−Vth). At this time, the current passing through the transistor T1 is:

$$I_{OLED} = \frac{1}{2} \cdot \mu_n \cdot \text{Cox} \cdot \frac{W}{L} \cdot [VREF - V_{DATA} + Vth - Vth]^2$$
$$= \frac{1}{2} \cdot \mu_n \cdot \text{Cox} \cdot \frac{W}{L} \cdot [VREF - V_{DATA}]^2$$

Wherein, $\mu_n$ is a carrier mobility, $C_{OX}$ is a gate oxide capacitance, W/L is a width to length ratio of the transistor, $V_{DATA}$ is the voltage in the data line shared by all pixel units, Vth is the threshold voltage of the transistor. As shown in the above equation, the current passing though the transistor T1 is independent of the threshold voltage thereof and the voltage across the OLED, instead, it is only dependent on the difference between the voltage on the data line and reference voltage. Therefore, the effect caused by the nonuniformity and the shift of the threshold voltage, and the nonuniformity of the OLED electrical characteristics is eliminated.

By adopting the pixel circuit having such structure, for either an enhanced TFT or a depleted TFT, the nonuniformity and the shift of the threshold voltage of the n-type depleted TFT or the enhanced TFT driving transistor, and the nonuniformity of the OLED may be effectively compensated, and display effect may be improved.

The embodiment of the present invention further provides a driving method for driving a pixel unit driving circuit, comprises:

A pixel charging step, wherein, the first control line SCAN (n) controls the second transistor T2 and the fourth transistor T4 to be on, the second control line SCAN (n+2) controls the third transistor T3 to be off, the data line DATA charges the first capacitor C1 through the second transistor T2 which is on, and makes the first transistor T1 on, the initial voltage input terminal VINIT charges the second capacitor C2 through the fourth transistor T4 which is on;

A pixel compensation step, wherein, the first control line SCAN (n) controls the second transistor T2 and the fourth transistor T4 to be off, the second control line SCAN (n+2) controls the third transistor T3 to be off, the high level output terminal ELVDD of the power supply charges the second capacitor C2 through the first transistor T1 which was turned on in the pixel charging step, until the voltage in the first terminal of the second capacitor C2 is $V_{DATA}$−Vth, wherein $V_{DATA}$ is the voltage signal from the data line and Vth is the threshold voltage of the first transistor T1;

A step of driving OLED to emit light, wherein, the first control line SCAN (n) controls the second transistor T2 and the fourth transistor T4 to be off, the second control line SCAN (n+2) controls the third transistor T3 to be on, the reference voltage input terminal VREF charges the first capacitor C1 through the third transistor T3 which is on, until the voltage at the second terminal J2 of the first capacitor C1 is at the level of the reference voltage input terminal and OLED is driven to emit light and display through the first transistor T1 which is on.

Wherein, the first control line is the first gate scanning signal control line and its pulse signal is at a high level during the period t1, a low level during the period t2 and a low level during the period t3.

The second control line is the second gate scanning signal control line and its pulse signal is: at a high level during the period t1, a low level during the period t2 and a high level during the period t3.

Wherein, the period t1 is the pixel charging phase, the period t2 is the pixel compensation phase and the period t3 is the phase for driving OLED to emit light.

The embodiment of the present invention further provides a display device, which comprises OLED and above mentioned pixel unit driving circuit. The source electrode of the first transistor included in the pixel unit driving circuit is connected to anode of the OLED. The cathode of the OLED is connected to the ground ELVSS.

The display device according to the embodiment of the present invention adopts the pixel circuit having such structure, for either an enhanced TFT or a depleted TFT, the nonuniformity and the shift of the threshold voltage of n-type depleted TFT or enhanced TFT driving transistor, and the nonuniformity of the OLED may be effectively compensated, and display effect may be improved.

The above mentioned are only the embodiments of the present disclosure, which is not intended to limit the protection scope of the present disclosure. Thus any change, alternative, and modification within the spirit and principle of the embodiment of the present disclosure should belong to the scope of protected by the present disclosure.

What is claimed is:

1. A method for driving a pixel unit driving circuit which is used for driving an Organic Light Emitting Diode (OLED) and comprises: a first transistor, a second transistor, a third transistor, a fourth transistor, a first capacitor and a second capacitor; wherein, a gate electrode of the first transistor is connected to a drain electrode of the second transistor, a source electrode of the first transistor is connected to a first terminal of the second capacitor, a drain electrode of the fourth transistor and the OLED respectively, a drain electrode of the first transistor is connected to a high level output terminal of a power supply; a gate electrode of the second transistor is connected to a first control line, a source electrode of the second transistor is connected to a data line, a drain electrode of the second transistor is connected to the gate electrode of the first transistor; a gate electrode of the third transistor is connected to a second control line, a source electrode of the third transistor is directly connected to a reference voltage input terminal, a drain electrode of the third transistor is connected to the gate electrode of the first transistor; a gate electrode of the fourth transistor is connected to the first control line, a source electrode of the fourth transistor is connected to an initial voltage input terminal, a drain electrode of the fourth transistor is connected to the first terminal of the second capacitor; a second terminal of the second capacitor is connected to a first terminal of the first capacitor, a second terminal of the first capacitor is connected to the gate electrode of the first transistor and the drain electrode of the second transistor; the reference voltage input terminal is connected to the first terminal of the first capacitor and the second terminal of the second capacitor, wherein the method comprises: a pixel charging step, wherein, the first control line controls the second transistor and the fourth transistor to be on, the second control line controls the third transistor to be off, the data line charges the first capacitor through the second transistor which is on, and makes the first transistor on, the initial voltage input terminal charges the second capacitor through the fourth transistor which is on; a pixel compensation step, wherein, the first control line controls the second transistor and the fourth transistor to be off, the second control line controls the third transistor to be off, the high level output terminal of the power supply charges the second capacitor through the first transistor turned on in the pixel charging step, until the voltage at the first terminal of the second capacitor is VDATA-Vth, wherein VDATA is a voltage signal of the data line and Vth is a threshold voltage of the first transistor; a step of driving the OLED to emit light, wherein, the first control line controls the second transistor and the fourth transistor to be off, the second control line controls the third transistor to be on, the reference voltage input terminal charges the first capacitor through the third transistor which is on, until the voltage at the second terminal of the first capacitor is at the level of the reference voltage input terminal, and the OLED is driven to emit light through the first transistor which is on.

2. The method according to claim 1, wherein,
the first control line is a first gate scanning signal control line and the second control line is a second gate scanning signal control line,
during a pixel charging phase, the first control line is at a high level, the second control line is at a low level;
during a pixel compensation phase, the first control line and the second control line are both at the low level;
during a phase for driving the OLED to emit light, the first control line is at the low level and the second control line is at the high level.

3. The method according to claim 1, wherein the first transistor, the second transistor, the third transistor and the fourth transistor are all N type thin film transistors.

4. The method according to claim 2, wherein the first transistor, the second transistor, the third transistor, and the fourth transistor are all N type thin film transistors.

5. The method according to claim 1, wherein the first transistor, the second transistor, the third transistor and the fourth transistor are all depleted thin film transistors.

6. The method according to claim 2, wherein the first transistor, the second transistor, the third transistor and the fourth transistor are all depleted thin film transistors.

* * * * *